United States Patent
Tsukamoto et al.

(10) Patent No.: US 7,343,276 B1
(45) Date of Patent: *Mar. 11, 2008

(54) RECORDING MEDIA INCLUDING CODE FOR ESTIMATING IC POWER CONSUMPTION

(75) Inventors: Yasutaka Tsukamoto, Sanda (JP); Hidetaka Minami, Ikeda (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/469,754

(22) Filed: Dec. 22, 1999

Related U.S. Application Data

(63) Continuation-in-part of application No. 08/879,696, filed on Jun. 19, 1997, now Pat. No. 6,094,527.

(30) Foreign Application Priority Data

Jun. 20, 1996 (JP) ................................. 8-159543

(51) Int. Cl.
G06F 17/50 (2006.01)
G06G 7/54 (2006.01)
H03K 19/00 (2006.01)

(52) U.S. Cl. ............................. 703/18; 703/15; 716/4; 716/17

(58) Field of Classification Search .................. 703/15, 703/13, 14, 18; 716/4, 17
See application file for complete search history.

(56) References Cited

U.S. PATENT DOCUMENTS

| 5,359,535 A | 10/1994 | Djaja |
| 5,473,548 A | 12/1995 | Omori |

(Continued)

FOREIGN PATENT DOCUMENTS

JP  2136775  5/1990

(Continued)

OTHER PUBLICATIONS

"Microsoft Press Computer Dictionary", Third Edition; Microsoft Press, Copyright 1997 (pp. 4, 81, 82, 107, 145, 146, 182, 183, 201 and 430).*

(Continued)

*Primary Examiner*—Paul L. Rodriguez
*Assistant Examiner*—Dwin M. Craig
(74) *Attorney, Agent, or Firm*—Cooper & Dunham, LLP

(57) ABSTRACT

A computer readable medium includes computer executable code stored thereon, the code for estimating power consumption of an integrated circuit, comprising code for simulating logic of basic and mega cells of the integrated circuit, code for estimating a current consumed by the mega cells by obtaining logic states for each mega cell, determining an average operation frequency for each logic state, and determining an alternating current component and a direct current component for each logic state to calculate said current consumed by the mega cells for estimating a first value of electric power consumed by said mega cells based on said logic simulations and pre-established power consumption data, code for estimating a current consumed by the basic cells for estimating a second value of electric power consumed by said basic cells based on said logic simulations and pre-established power consumption data and code for combining said first and second values to obtain the power consumption of the integrated circuit.

40 Claims, 8 Drawing Sheets

U.S. PATENT DOCUMENTS

| | | | |
|---|---|---|---|
| 5,481,469 A * | 1/1996 | Brasen et al. | 702/60 |
| 5,493,508 A * | 2/1996 | Dangelo et al. | 716/5 |
| 5,521,834 A * | 5/1996 | Crafts et al. | 716/6 |
| 5,535,370 A * | 7/1996 | Raman et al. | 703/15 |
| 5,557,531 A | 9/1996 | Rostoker | |
| 5,625,803 A * | 4/1997 | McNelly et al. | 703/14 |
| 5,740,407 A | 4/1998 | Yeap et al. | |
| 5,835,380 A | 11/1998 | Roethig | |
| 5,867,397 A * | 2/1999 | Koza et al. | 703/14 |
| 5,889,685 A | 3/1999 | Ramachandran | |
| 5,943,487 A * | 8/1999 | Messerman et al. | 716/11 |
| 6,094,527 A * | 7/2000 | Tsukamoto et al. | 703/18 |
| 6,324,678 B1 * | 11/2001 | Dangelo et al. | 716/18 |

FOREIGN PATENT DOCUMENTS

| | | |
|---|---|---|
| JP | 4130661 | 5/1992 |
| JP | 5-73634 | 3/1993 |
| JP | 5-165912 | 7/1993 |
| JP | 6-317616 | 11/1994 |
| JP | 8-44788 | 2/1996 |

OTHER PUBLICATIONS

English Machine Translation of Japanese Laid Open Application Number JP,06-317616,A(1994), 14 pages.*

* cited by examiner

FIG. 2
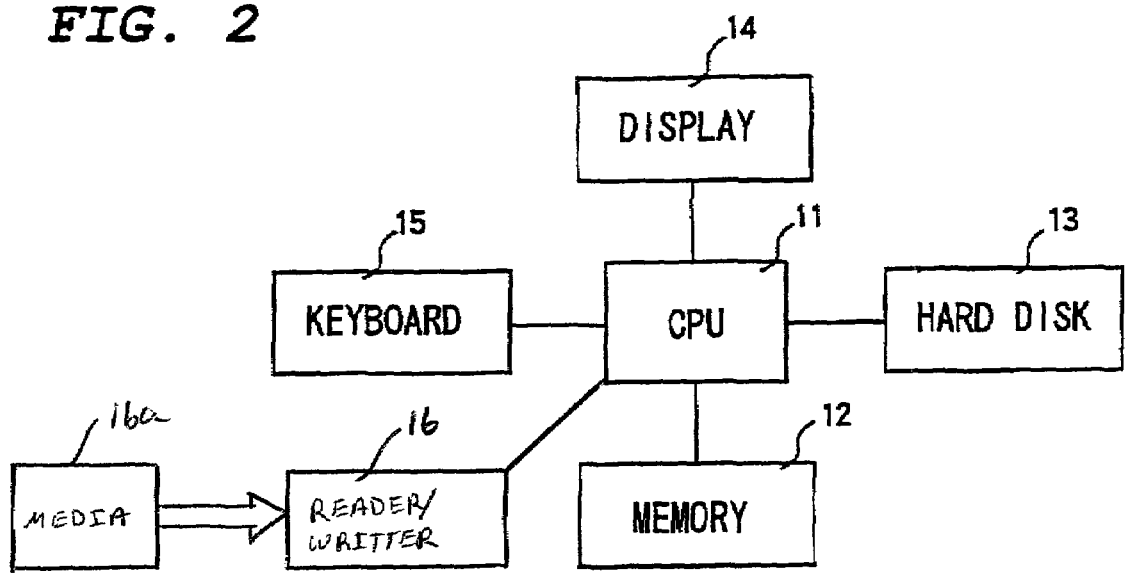
FIG. 3
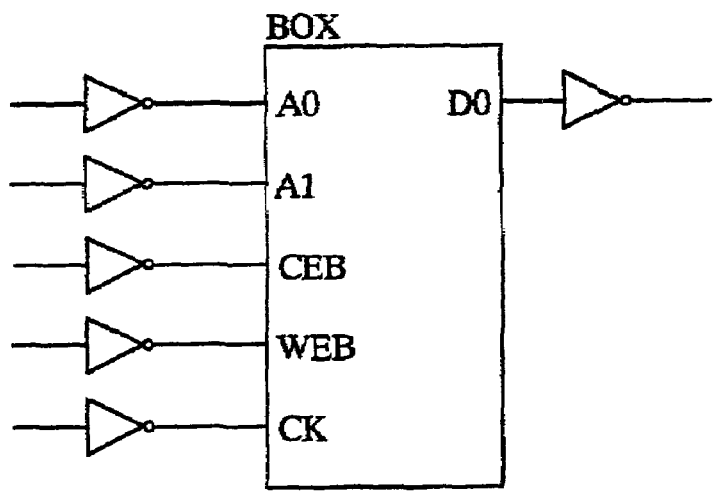
FIG. 4
| CELL NAME | RAM |
|---|---|
| CELL TYPE | SYNCHRONOUS |
| FREQUENCY SIGNAL | CK |
| STATE LIST | standby, read, write |

| STATE | STATE DEFINING CONDITION | AC CURRENT | DC CURRENT |
|---|---|---|---|
| standby | CEB=1 | 0 | S |
| read | WEB=1 && CEB=0 | $X \times f$ | D0−Z(1) |
| write | WEB=0 && CEB=0 | $Y \times f$ | 0 |

FIG. 10

| INSTRUCTION | POWER CONSUMPTION |
|---|---|
| ADD | W0 |
|  |  |
| LDA | Wa |
|  |  |
| STA | Wb |
|  |  |

FIG. 11

```
         ⋮
         ⋮
   always begin
         ⋮
         ⋮
       Inst_LDA;
         ⋮
         ⋮
       Inst_STA;
         ⋮
         ⋮
   end
         ⋮
         ⋮
   task Inst_LDA;
      begin
         ⋮
         ⋮
         $PowerAnalysis("LDA");
      end
   endtask
         ⋮
   task Inst_STA;
      begin
         ⋮
         ⋮
         $PowerAnalysis("STA");
      end
   endtask
         ⋮
         ⋮
```

RECORDING MEDIA INCLUDING CODE FOR ESTIMATING IC POWER CONSUMPTION

CROSS-REFERENCE TO RELATED APPLICATIONS

This is a continuation-in-part of application Ser. No. 08/879,696 filed Jun. 19, 1997, now U.S. Pat. No. 6,094,527 the entire contents of which are herein incorporated by reference.

BACKGROUND

1. Field of the Invention

This invention relates to computer readable recording media including computer executable code and a programmed processor for estimating electric power consumption by integrated circuits which are comprised of basic cells and mega cells.

2. Description of the Related Art

As circuit components and systems thereof become exceedingly more complex, it is necessary to estimate power consumption by circuit components and integrated circuits with the highest possible accuracy. Several methods have heretofore been developed for estimating electric power consumed by integrated circuits and circuit components at the stage of circuit designing.

One conventional method is described in Japanese Laid-Open Patent Application 2-136775 which discloses a method that: (a) obtains numbers of operation events at terminals or pins of each basic cell from the results of logic simulations; and (b) estimates power consumption based on the number of events obtained and pre-established established data of electric power consumption by each basic cell. Using this information the power consumed by an integrated circuit is estimated.

Another conventional method for power estimation of an integrated circuit is carried out by obtaining information on each basic cell: (a) changes in output voltage signals with time; (b) program instructions for the operation modes; and © power consumption by the basic cells. Using this information the power consumed by an integrated circuit is estimated. Such a method is described in Japanese Laid-Open Patent Application 4-130661.

The above-mentioned conventional methods estimate power consumed by basic cells, but are insufficient to accurately estimate power consumption for integrated circuits including mega cells.

Therefore, it would be desirable to provide a method and an apparatus for estimating electric power consumed by integrated circuits and/or a circuit system which includes mega cells as well as basic cells.

SUMMARY OF THE INVENTION

A computer readable medium includes computer executable code stored thereon, the code for estimating power consumption of an integrated circuit, comprising code for simulating logic of basic and mega cells of the integrated circuit, code for estimating a current consumed by the mega cells by obtaining logic states for each mega cell, determining an average operation frequency for each logic state, and determining an alternating current component and a direct current component for each logic state to calculate said current consumed by the mega cells for estimating a first value of electric power consumed by said mega cells based on said logic simulations and pre-established power consumption data, code for estimating a current consumed by the basic cells for estimating a second value of electric power consumed by said basic cells based on the logic simulations and pre-established power consumption data and code for combining the first and second values to obtain the power consumption of the integrated circuit.

According to another embodiment, a computer readable medium includes computer executable code stored there, the code for estimating electric power consumed by basic cells and mega cells of an integrated circuit to estimate total power consumed by the integrated circuit, comprising code for simulating logic of the basic cells and the mega cells, wherein each function of each mega cell for logic simulation is defined by hardware description language, code for estimating a current consumed by the basic cells for estimating a first value of electric power consumed by the basic cells based on logic simulation results from the logic simulations and pre-established power consumption data for each logic state of each input and output terminal of the basic cells, code for estimating a current consumed by the mega cells by obtaining logic states for each mega cell, determining an average operation frequency for each logic state, and determining an alternating current component and a direct current component for each logic state to calculate the current consumed by the mega cells for estimating a second value of electric power consumed by the mega cells based on logic simulation results from the logic simulations and pre-established power consumption data for the logic states, variables in the function description, and the operating frequencies at each input and output terminal of each mega cell and code for adding the first and the second values of the power consumption to determine the total power consumption for the integrated circuit.

According to another embodiment, a computer readable medium includes computer executable code stored thereon, the code for estimating power consumption of an integrated circuit, comprising code for compiling a table which tabulates data of electric power consumed by mega cells of the integrated circuit during operation, code for simulating logic of the mega cells and basic cells of the integrated circuit, wherein data from the table is used when simulating logic of the mega cells, code for estimating a current consumed by the mega cells by obtaining logic states for each mega cell, determining an average operation frequency for each logic state, and determining an alternating current component and a direct current component for each logic state to calculate the current consumed by the mega cells for estimating a first value of electric power consumed by the mega cells based on results from the logic simulations, code for estimating a current consumed by the basic cells for estimating a second value of electric power consumed by the basic cells based on logic simulation results from the simulations and pre-established power consumption data for each logic state at each input and output terminal of the basic cells and code for adding the first and the second values to obtain the power consumption of the integrated circuit.

The computer readable medium may a floppy disk such as a 3.5 inch diskette, a compact disk such as a read-only CD or a read/write CD. The computer readable medium may also be a DVD. The computer executable code may be in compressed or noncompressed form.

BRIEF DESCRIPTION OF THE DRAWINGS

Preferred embodiments of the invention are described hereinbelow with reference to the drawings wherein:

FIG. 2 is a block diagram of a computing system having a CPU and memory that includes the power consumption estimating system of FIG. 1;

FIG. 3 is a schematic representation of a mega cell;

FIG. 4 is a table for storing data representing power consumed for various functions performed by the mega cell of FIG. 3;

FIG. 10 is a table for storing power consumption data associated with the method of FIG. 8; and FIG. 11 is an exemplary pseudo code representation providing instructions executed by a mega cell and used in conjunction with FIG. 10.

DETAILED DESCRIPTION

Figure 1:
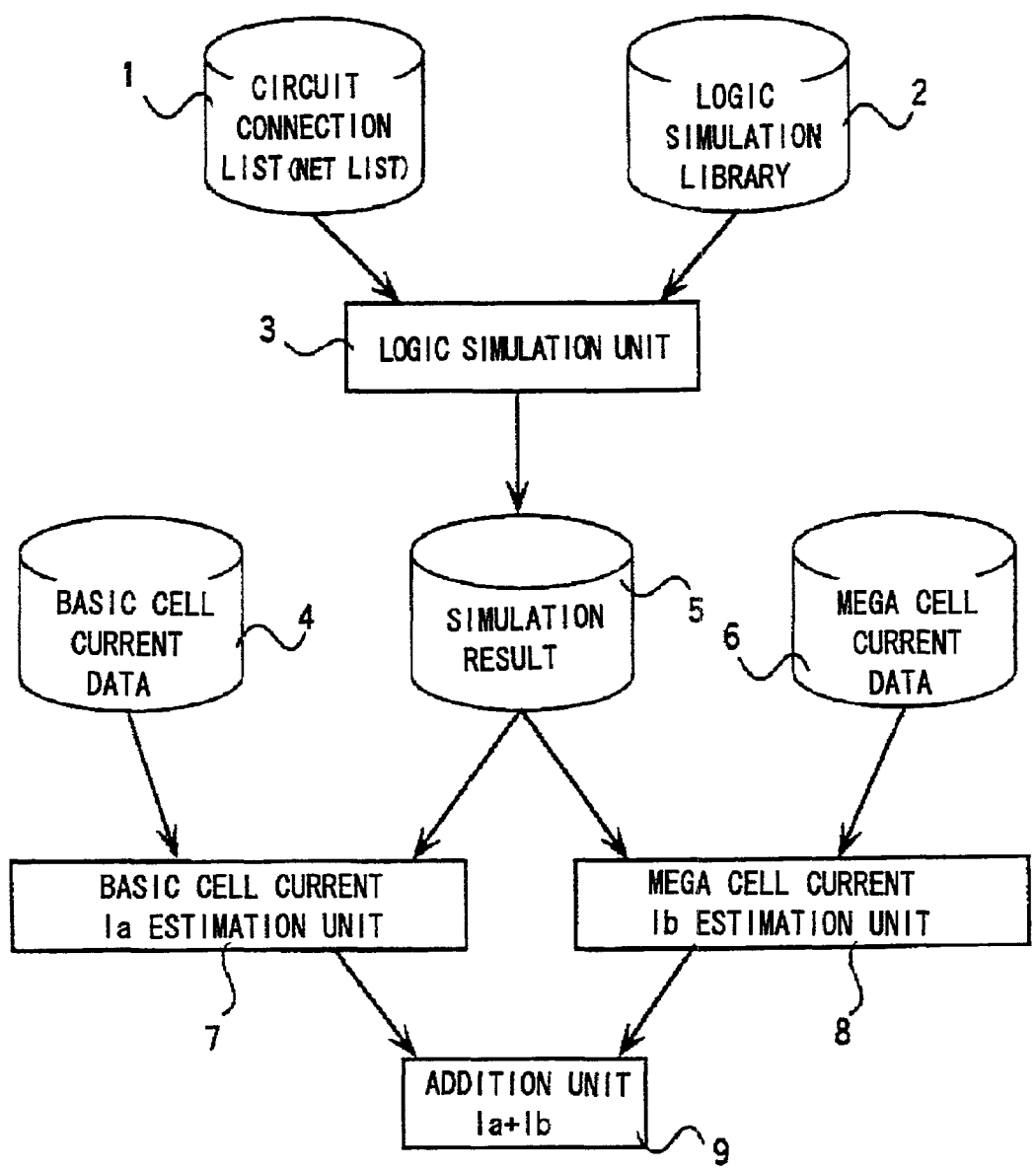
FIG. 1 is a functional block diagram of a system for estimating electric power consumption by basic cells and mega cells in accordance with one embodiment of the present application.

Referring to FIGS. 1 and 2, the computing system includes CPU 11, memory 12 (e.g., RAM and/or ROM), hard disk 13, display 14 and keyboard 15. The computing system may also include an internal or external storage medium reader/writer 16 for reading data from and/or writing data to removable storage media 16a. Various types of removable storage media include, but are not limited to, floppy disks (e.g., 5.25 in., 3.5 in disks), CDs including read only or read/write CDs, DVD, etc. As described herein, removable storage media 16a may also be considered as representing a server such as, for example, an Internet server. Reader/writer 16 may then be considered as representing an Internet access system for accessing and downloading data, software, etc. therefrom. The system may include compression/decompression circuitry or functions for compressing data or software stored to the media and for decompressing compressed data or software read from the media. The hard disk 13 stores a circuit connection list 1 and a logic simulation library 2, and also functions as a basic cell current data storage unit 4 and a mega cell current data storage unit 6. In the alternative, the circuit connection list 1 and the logic simulation library 2, as well as the basic cell current data storage unit 4 and the mega cell current data storage unit 6 can be stored on one or more removable storage media 16a and input via the internal or external storage media reader/writer 16. The CPU 11 together with programs stored in the memory 12 functions as a logic simulation unit 3, estimation units 7 and 8 and an addition unit 9, seen in FIG. 1. Computer executable code or software programs for performing the methods and functions (including the functions of logic simulation unit 3, estimation units 7, 8 and addition unit 9) described herein can be stored on one or more removable storage media 16a and can be executed from the storage media or downloaded into memory 12 for execution by CPU 11. The estimation unit 7 estimates current consumption by the basic cells Ia, and estimation unit 8 estimates current consumption by the mega cells Ib.

In the basic cell current data storage unit 4, there is stored current consumption data previously established for each logic state of each basic cell at each terminal (e.g., input and output terminal). The mega cell current data storage unit 6 stores current consumption data previously established for each logic state, each variable in the function description, and the operating frequency for each state of each mega cell at each terminal (e.g., input and output terminal).

In the circuit connection list 1, seen in FIG. 1, there is stored circuit connection information for the basic and mega cells of an integrated circuit for which an estimate of power consumption by the circuit is being obtained. For the mega cells, functions, e.g., operational states, are described with the hardware description language that is also included in the list 1.

The logic simulation library 2 stores simulation data for each basic and mega cell whose operation is simulated. Circuit connection data from the circuit connection list 1 and simulation data stored in the logic simulation library 2 for each basic and mega cell in the integrated circuit being simulated are transferred to the logic simulation unit 3 and the logic simulation unit simulates operation of the integrated circuit design. The results of the simulation are stored in a logic simulation result memory 5.

Continuing to refer to FIGS. 1 and 2, the estimation unit 7 estimates the current consumed by the basic cells Ia, which is a portion of the total of current consumed by the integrated circuit. For example, the estimate of the current Ia may be based on: (a) the simulation results; and (b) the data previously stored in the basic cell current data storage unit 4. The estimated current consumed by the basic cells Ia can be expressed by the following equation:

$$Ia_{tot} = Ia_1 + Ia_2 + \ldots + Ia_n$$

where Ia is the current consumed by each of 1 thru n basic cells.

The mega cell estimation unit 8 estimates the current consumed by the mega cells Ib, which is a portion of the total current consumed by the integrated circuit. For example, the estimated current consumed by the mega cells Ib may be based on: (a) the simulation results; and (b) the data previously stored in the mega cell current data storage unit 6. The current Ib can be expressed by the following equation:

$$Ib_{tot} = Ib_1 + Ib_2 + \ldots + Ib_m$$

where Ib is the current consumed by each of 1 thru m mega cells.

The addition unit 9 combines the estimated current consumed by the basic cells $Ia_{tot}$ and the estimated current consumed by the mega cells $Ib_{tot}$ to obtain the total current consumed by the integrated circuit.

A method for estimating the current consumed by the mega cells Ib is detailed below. Initially, the logic states for each mega cell are obtained. Once the logic states are obtained, the average operation frequency f for each state is determined. For synchronous type mega cells, the average operation frequency f for a state is determined by counting the number of clock pulses P for the time period $t_{state}$ that the cell is in a particular state and dividing P by that time period.

Thus, the average operation frequency f for synchronous type mega cells can be expressed as:

$$f = P/t_{state}$$

Asynchronous type mega cells are operated by various pulses, e.g., trigger pulses originating from other parts of a system. Thus, the average operation frequency f for each state depends on the particular pulse triggering the cell.

The AC component of consumed current $I_{AC}$ and the DC component of consumed current $I_{DC}$ for each state are then determined using known techniques and the average current consumed by the mega cell $I_{MC}$ can be expressed as:

$$I_{MC} = I_{comp}/T$$

where $I_{comp} = I_{AC} + I_{DC}$ (i.e., the sum of each component of consumed current for each state time period $t_{state}$, and T is the time period for the mega cell operation.

The above calculations for current consumption are carried out for each mega cell included in the integrated circuit. Subsequently, by adding the values of the current consumption obtained above for the mega cells and the basic cells, the total current consumed by an integrated circuit can be accurately estimated.

Referring now to FIG. 3 a schematic representation of a mega cell identified as "BOX" is shown. This mega cell has input terminals A0, A1, CEB, WEB, and CK and output terminal D0. This mega cell is specifically characterized as a RAM of the synchronous type, which is driven by clock signal CK and has logic states, such as "standby", "read", or "write". Current data for this mega cell is stored in the mega cell current data storage unit 6, preferably in the form of a table. The table in FIG. 4 stores cell data, such as the name, type (synchronous or asynchronous), frequency signal, and a state list of the mega cell.

The above-mentioned clock signal is one to which the operation frequency of the mega cell is referred. The clock signal may also be expressed by an internal variable, as well as the external terminal of the mega cell. As seen in FIG. 4, the exemplary mega cell BOX has a plurality of states which consume different amounts of current.

Figures 5, 6:
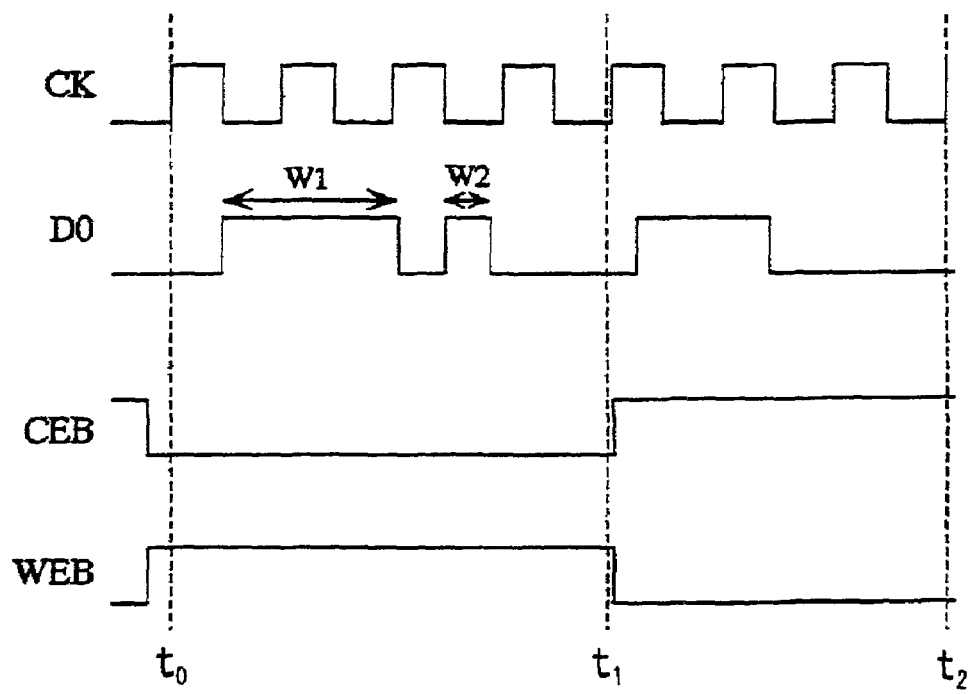
FIG. 5 is another table for storing current consumption data for various states of the mega cell of FIG. 3.
FIG. 6 is a timing diagram which illustrates the change of logic variables at input or output terminals of the mega cell of FIG. 3.

The table of FIG. 5 stores cell data such as data representing: (a) conditions for determining the cell states, e.g., standby, read, or write; and (b) AC and DC current consumption components for each state of the mega cell. The AC and DC current consumption components can be expressed by the equations, seen in FIG. 5, for each state. The variables, such as CEB or WEB, for example, may also be expressed by an internal variable as well as the external terminals of the mega cell. Thus, in the exemplary table of FIG. 5, if CEB=1 (high), the mega cell is in the standby state.

The AC current component of the exemplary table of FIG. 5 represents the component of the current consumed by the mega cell which varies with an operation frequency f of each state. For the exemplary table of FIG. 5, the AC current component is linearly dependent on the operation frequency f of the particular state, where the AC current is zero in the standby state, X×f in the read state, and Y×f shown in FIG. 5. However, the dependence of the current is not limited to the above equations, and may also be expressed by other forms such as, for example, equations with more complex forms in terms of the frequency or data given as a table.

The DC current component represents the component of the current which does not vary with the operation frequency (f). In the table of FIG. 5, the DC current component has a value S when in the standby state, a value Z when D0 becomes 1 (high) in the read state, and the DC current is zero when in the write state. A value for the current flow Z is obtained from previous measurements.

The timing diagram of FIG. 6 illustrates changes in logic variables at each of the input and output terminals of the mega cell BOX. These changes in the logic variables are obtained from the logic simulation of the cell and can be output from the simulation result memory 5 to the mega cell estimation unit 8.

Figure 7:
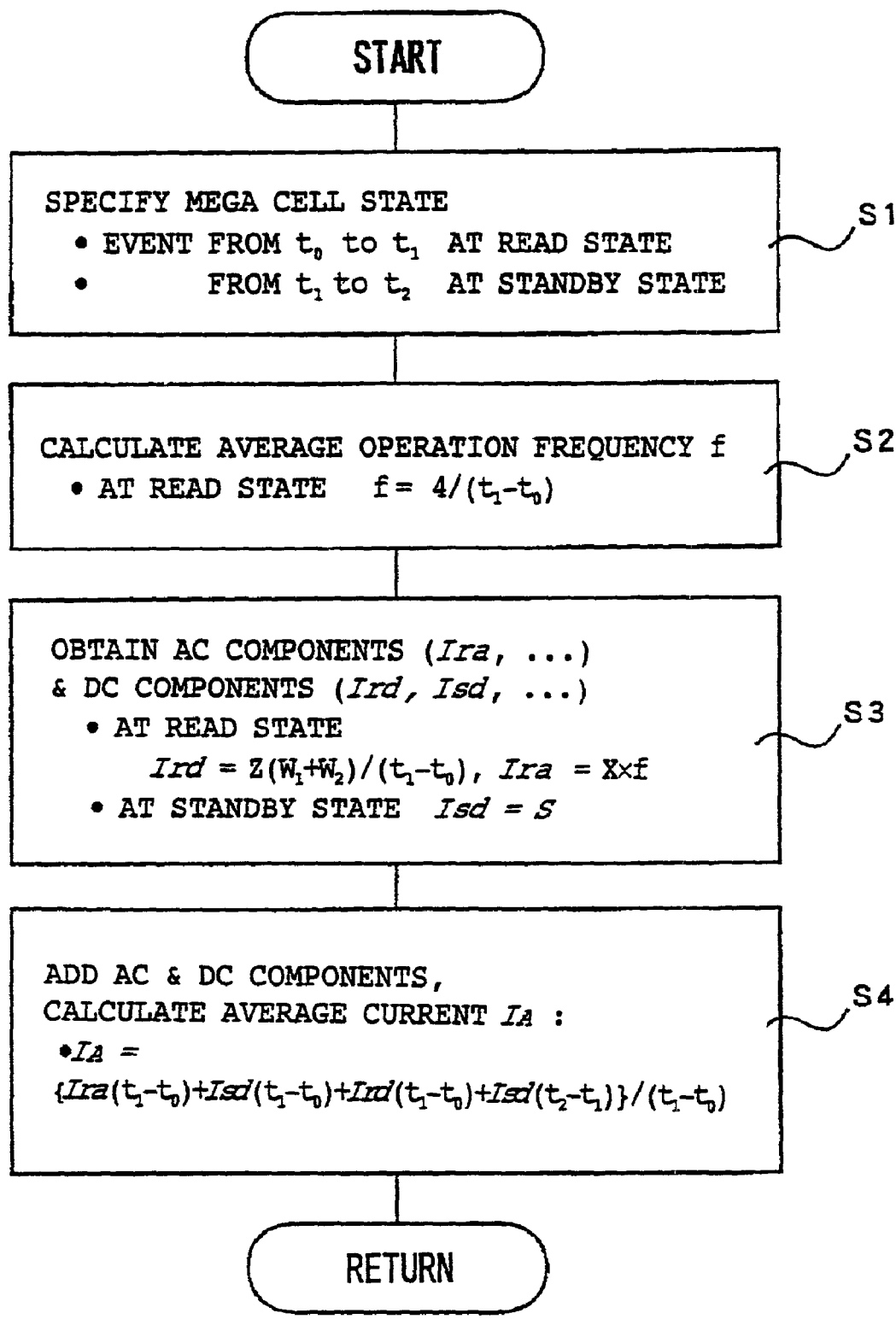
FIG. 7 is a flow chart which illustrates a sequence for determining the power consumed by an integrated circuit according to one embodiment of the present application.

As an illustration, FIG. 7 is a flow chart illustrating a sequence for estimating electric power consumption of an integrated circuit for the mega cell of FIGS. 3–6. Initially, the states of the mega cell of FIG. 3 are specified with time by referring to the results of the logic simulation (step 1). As seen in FIG. 6, the logic simulation results indicate that the mega cell is in the read state from time $t_0$ to $t_1$, since CEB is 0 (low) and WEB is 1 (high) for this period, and in the standby state during $t_1$, to $t_2$, since CEB is 1 (high).

The average operation frequency f for each state is then obtained. The table of FIG. 4 indicates that the frequency signal of the mega cell, which is a synchronous type cell, is determined by from the clock signal CK. As seen in FIG. 6, the clock signal CK has 4 pulses during the read state from $t_0$ to $t_1$. From the number of the pulses (P=4) and the time length ($t_{state} = t_1 - t_0$) the average operation frequency is calculated using the following equation (step 2):

$$f = 4/(t_1 - t_0)$$

Subsequently, the AC and DC current consumption components for each state identified in the table of FIG. 4 are calculated (step 3). In the read state the AC current consumption component Ira can be expressed as:

$$Ira = X \times f$$

where X is a constant pre-established by experiment or measurement, and the DC current consumption component Ird can be expressed as:

$$Ird = Z(W_1 + W_2)/(t_1 - t_0)$$

where Z is a constant pre-established by experiment or measurement, and $W_1$ and $W_2$ are time fractions for. When D0 is logic 1 (high) Ird is Z for the time period for which D0 is high.

When the cell is in the standby state from $t_1$ to $t_2$, the DC current consumption component in the standby state Isd can be expressed as:

$$Isd = S$$

where S is a constant pre-established by experiment or measurement.

The average current consumed by the mega cell $I_{MC}$ during time $t_0$ to $t_2$ is calculated using the following equation (step 4):

$$I_{MC} = I_{comp}/T$$

$$I_{MC} = (Ira(t_1-t_0) + Ird(t_1-t_0) + Isd(t_2-t_1))/(t_2-t_0)$$

Figure 8:
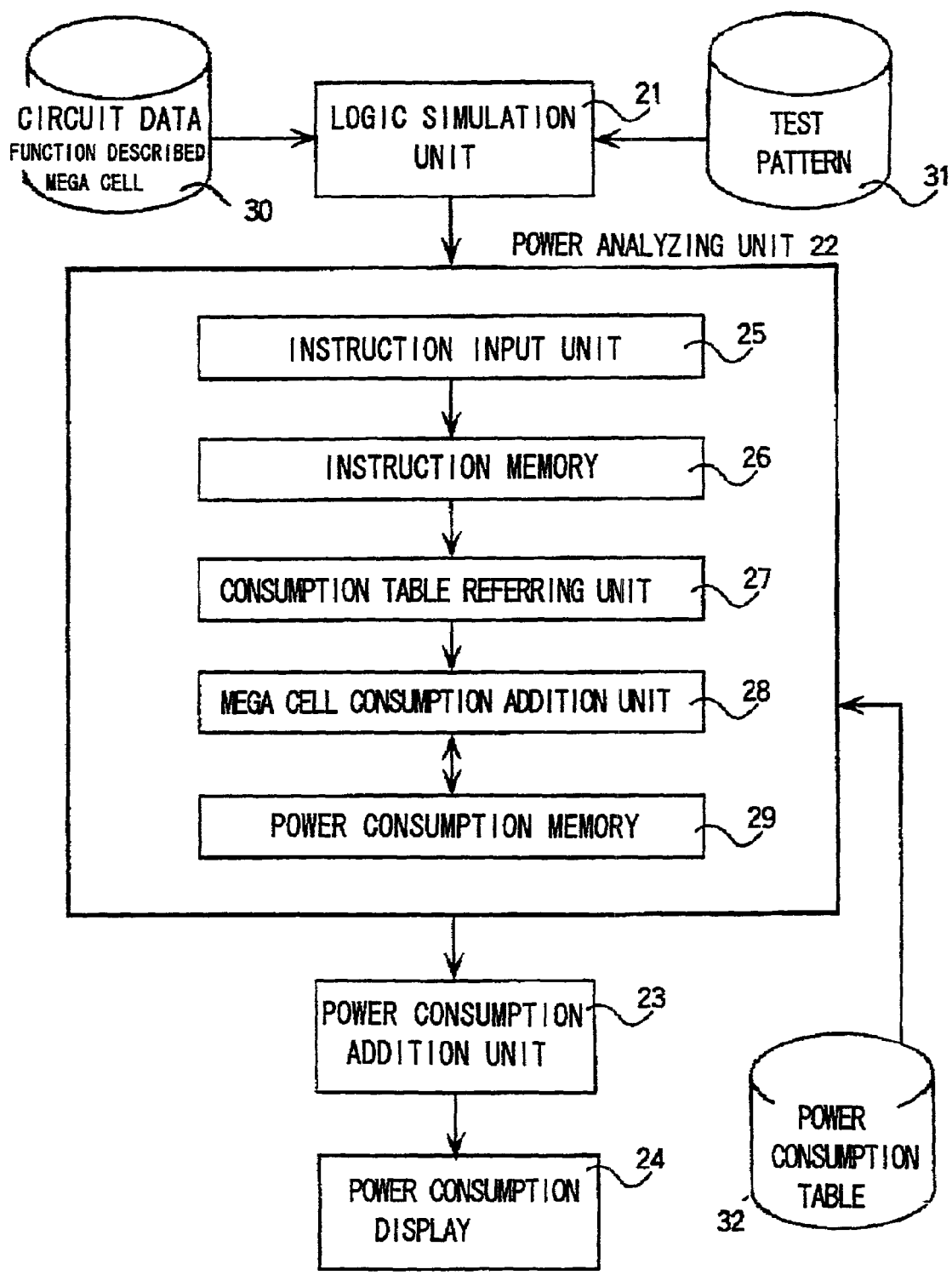
FIG. 8 is a functional block diagram of a system for estimating electric power consumption of integrated circuits in accordance with a another embodiment of the present application.

Referring to FIG. 8 a functional block diagram of a system for estimating electric power consumption of integrated circuits in accordance with a second embodiment of the present application is shown. In this embodiment, the power consumption estimating system includes logic simulation unit 21 for carrying out logic simulations and a power consumption analyzing unit 22 for estimating power consumption by mega cells. A power consumption addition unit 23 is provided to calculate the total power consumption by an integrated circuit. Circuit data (e.g., functional description data for each mega cell) used to perform logic simulations for each mega cell are stored in circuit data storage unit 30. A test pattern data storage unit 31 stores test pattern information for logic simulations, and a power consumption table 32 stores power consumption data for each mega cell for each operation instruction.

In addition, the power consumption analyzing unit 22 is provided with an instruction input unit 25 which inputs instructions given to mega cells during logic simulations, an instruction memory 26 for storing inputted instructions, a power consumption table referring unit 27 for outputting power consumption values from the power consumption table 32, a mega cell power consumption addition unit 28 for adding power consumption values of each mega cell, and a power consumption memory 29 for storing power consumption values obtained.

Figure 9:
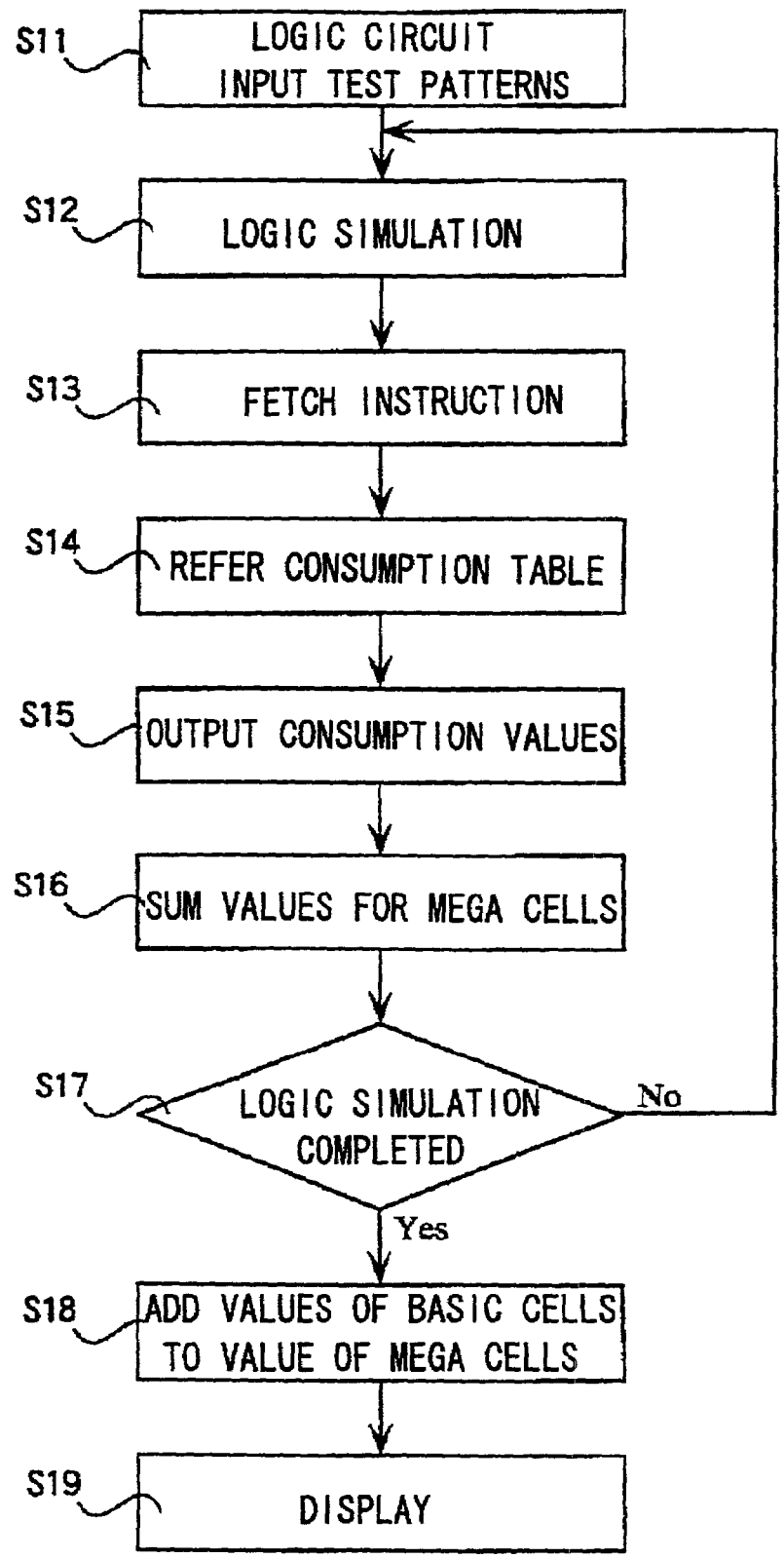
FIG. 9 is a flow chart which illustrates a sequence for determining the power consumed by an integrated circuit according to another embodiment of the present application.

FIG. 9 is a flow chart illustrating a sequence for estimating electric power consumption of an integrated circuit in accordance with a second embodiment of the application. The method according to this embodiment will be discussed with reference to FIGS. 8 and 9. The logic simulation unit 21 inputs test patterns (step 11) for mega cells for which each function of the cells is described by the hardware description language, and carries out logic simulations (step 12). If the mega cell fetches an instruction during the logic simulations, the instruction input unit 25 in the power consumption analyzing unit 22 inputs the above-mentioned instruction. In the mega cell, appropriate functions are previously described for the mega cell to deliver a message to the instruction input unit 25 upon fetching the instruction. Examples of such functions will be discussed below.

Subsequently, the instruction memory 26 stores the message and the consumption power table referring unit 27 refers data of power consumption 32 (step 14). The table 32 has previously been constructed with power consumption data for the mega cells corresponding to each program instruction as illustrated in FIG. 10.

The consumption power table referring unit 27 then outputs power consumption values from the power consumption table 32 (step 15). The mega cell power consumption addition unit 28 then combines the power consumption values of each mega cells outputted from the above-mentioned table 32 (step 16), and the results are stored in the power consumption memory 29.

Subsequently, it is determined whether a logic simulation for each mega cells has been performed (step 17). If a simulation for each mega cell has not been performed, the simulation process proceeds to step 12 to begin simulation of another mega cell. If a simulation for each mega cell has been performed, then power consumption values for other cells, e.g., basic cells, are added to the power consumption values for the mega cells by the power consumption addition unit 23 so that the power consumption for the entire integrated circuit is obtained (step 18) and displayed on the display 14 (step 19).

Referring now to FIG. 11, a pseudo code representation providing program instructions for a mega cell, such as a CPU or DSP, is shown. When an instruction LDA is fetched by, for example, a CPU during logic simulations, the instruction input unit 25 inputs an instruction by a function $PowerAnalysis and the instruction memory 26 then stores the message LDA. The function $PowerAnalysis is described so as to be always outputted when the instruction is fetched by the mega cell and also acts to transfer the fetched message to the instruction input unit 25. The power consumption table referring unit 27 outputs a power consumption value Wa (FIG. 10) stored in the power consumption table 32 corresponding to the instruction LDA. The value Wa is then stored in the power consumption memory 29.

In a similar manner, when an instruction STA is fetched by, for example, a CPU or DSP during logic simulation, the instruction input unit 25 inputs the instruction STA by another function $PowerAnalysis. The instruction STA is subsequently stored in the instruction memory 26. The power consumption power table referring unit 27 then outputs a power consumption values (Wb) previously stored in the table 32 corresponding to the instruction STA (FIG. 10). The value Wb is then stored in the power consumption memory 29.

The simulation processes such as described above are repeated until the logic simulations are completed for all mega cells. When the simulations are completed, power consumption values for the mega cells and cells other than the mega cells, (e.g., basic cells) are added by the power consumption addition unit 23 to obtain the power consumption value for the integrated circuit, which is then displayed on the display 14.

By the method and apparatus of the present application, more accurate estimations of the power consumption of integrated circuits can be obtained. The methods according to the present application provide power consumption estimates prior to manufacturing which is useful for manufacturing more efficient integrated circuits at lower cost.

Each of the above-mentioned methods and functions can be readily implemented using one or more conventional general purpose digital computers and/or servers programmed according to the teachings of the present specification, as will be apparent to those skilled in the computer art. Appropriate software coding can be readily prepared by skilled programmers based on the teachings of the present disclosure, as will be apparent to those skilled in the programming arts. The present invention may also be implemented by the preparation of application specific integrated circuits or by interconnecting an appropriate network of conventional component parts, as will be readily apparent to those skilled in the art.

Additional modifications and variations of the present invention are possible in light of the above teachings. It is therefore to be understood that within the scope of the appended claims, the invention may be practiced otherwise than as specifically described herein.

What is claimed is:

1. A computer readable medium including computer executable code stored thereon, the code being executable by a processor to perform a method for estimating power consumption of an integrated circuit comprising:
   simulating logic of basic and mega cells of the integrated circuit;
   estimating a first value of electric power consumed by said mega cells based on said logic simulations and pre-established power consumption data, including estimating a current consumed by the mega cells by obtaining logic states for each mega cell, determining an average operation frequency for each logic state, and determining an alternating current component and a direct current component for each logic state to calculate said current consumed by the mega cells;
   estimating a second value of electric power consumed by said basic cells based on said logic simulations and pre-established power consumption data, including estimating a current consumed by the basic cells; and
   combining said first and second values to obtain the power consumption of the integrated circuit.

2. A computer readable medium as recited in claim 1, wherein the computer readable medium comprises a floppy disk.

3. A computer readable medium as recited in claim 2, wherein the floppy disk comprises a 3.5 inch diskette.

4. A computer readable medium as recited in claim 1, wherein the computer readable medium comprises a compact disk.

5. A computer readable medium as recited in claim 4, wherein the compact disk is a read-only disk.

6. A computer readable medium as recited in claim 4, wherein the compact disk is a read/write disk.

7. A computer readable medium as recited in claim 1, wherein the computer readable medium comprises a DVD.

8. A computer readable medium as recited in claim 1, wherein the computer executable code is one of compressed and noncompressed.

9. A computer readable medium including computer executable code stored thereon, the code being executable by a processor to perform a method for estimating electric power consumed by basic cells and mega cells of an integrated circuit to estimate total power consumed by the integrated circuit, the method comprising:
   simulating logic of said basic cells and said mega cells, wherein each function of each mega cell for logic simulation is defined by hardware description language;
   estimating a first value of electric power consumed by said basic cells based on logic simulation results from said logic simulations and pre-established power consumption data for each logic state of each input and output terminal of said basic cells, including estimating a current consumed by the basic cells;
   estimating a second value of electric power consumed by said mega cells based on logic simulation results from said logic simulations and pre-established power consumption data for said logic states, variables in the function description, and said operating frequencies at each input and output terminal of each mega cell, including estimating a current consumed by the mega cells by obtaining logic states for each mega cell, determining an average operation frequency for each logic state, and determining an alternating current component and a direct current component for each logic state to calculate said current consumed by the mega cells; and
   adding said first and said second values of the power consumption to determine the total power consumption for the integrated circuit.

10. A computer readable medium as recited in claim 9, wherein the computer readable medium comprises a floppy disk.

11. A computer readable medium as recited in claim 10, wherein the floppy disk comprises a 3.5 inch diskette.

12. A computer readable medium as recited in claim 9, wherein the computer readable medium comprises a compact disk.

13. A computer readable medium as recited in claim 12, wherein the compact disk is a read-only disk.

14. A computer readable medium as recited in claim 12, wherein the compact disk is a read/write disk.

15. A computer readable medium as recited in claim 9, wherein the computer readable medium comprises a DVD.

16. A computer readable medium as recited in claim 9, wherein the computer executable code is one of compressed and noncompressed.

17. A computer readable medium including computer executable code stored thereon, the code being executable by a processor to perform a method for estimating power consumption of an integrated circuit, the method comprising:
   compiling a table which tabulates data of electric power consumed by mega cells of the integrated circuit during operation;
   simulating logic of said mega cells and basic cells of the integrated circuit, wherein data from said table is used when simulating logic of said mega cells;
   estimating a first value of electric power consumed by said mega cells based on results from said logic simulations, including estimating a current consumed by the mega cells by obtaining logic states for each mega cell, determining an average operation frequency for each logic state, and determining an alternating current component and a direct current component for each logic state to calculate said current consumed by the mega cells;
   estimating a second value of electric power consumed by said basic cells based on logic simulation results from said simulations and pre-established power consumption data for each logic state at each input and output terminal of said basic cells, including estimating a current consumed by the basic cells; and
   adding said first and said second values to obtain the power consumption of the integrated circuit.

18. A computer readable medium as recited in claim 17, wherein the computer readable medium comprises a floppy disk.

19. A computer readable medium as recited in claim 18, wherein the floppy disk comprises a 3.5 inch diskette.

20. A computer readable medium as recited in claim 17, wherein the computer readable medium comprises a compact disk.

21. A computer readable medium as recited in claim 20, wherein the compact disk is a read-only disk.

22. A computer readable medium as recited in claim 20, wherein the compact disk is a read/write disk.

23. A computer readable medium as recited in claim 17, wherein the computer readable medium comprises a DVD.

24. A computer readable medium as recited in claim 17, wherein the computer executable code is one of compressed and noncompressed.

25. A programmable computer for estimating power consumption of an integrated circuit comprising:
   processor;
   storage media for storing computer executable code executable by the processor to perform a method for estimating power consumption of an integrated circuit, the method including:
      carrying out logic simulations of circuit data for basic cells and mega cells of the integrated circuit;
      estimating a first value of electric power consumed by said mega cells based on the results of said logic simulations and pre-established power consumption data, including estimating a current consumed by the mega cells by obtaining logic states for each mega cell, determining an average operation frequency for each logic state, and determining an alternating current component and a direct current component for each logic state to calculate said current consumed by the mega cells;
      estimating a second value of electric power consumed by said basic cells based on the results of said logic simulations and pre-established power consumption data, including estimating a current consumed by the basic cells; and combining said first and second values of electric power consumed by said mega and basic cells so as to obtain the power consumption of the integrated circuit.

26. A programmable computer as recited in claim 25, further comprising a read/write unit in which a computer readable media including computer executable code can be input, the computer executable code being downloaded from the computer readable media to the storage media via the read/write unit for execution by the processor.

27. A programmable computer as recited in claim 26, wherein the computer executable code is stored on the computer readable media in compressed format and is decompressed and downloaded to the storage media.

28. A programmable computer as recited in claim 26, wherein the computer readable media comprises at least one of a floppy disk, a CD, DVD and an Internet server.

29. A programmable computer for estimating power consumption of an integrated circuit, comprising:

processor;

storage media for storing computer executable code executed by the processor to perform a method for estimating power consumption of an integrated circuit, the method including:

carrying out logic simulations of circuit data for basic cells and mega cells of the integrated circuit;

estimating a first value of electric power consumed by said basic cells, including estimating a current consumed by the basic cells, said estimate of the first value being based on logic simulation results obtained by said simulation means and pre-established power consumption data for each logic state at each input and output terminal of said basic cells;

estimating a second value of electric power consumed by said mega cells, said estimate of the second value being based on logic simulation results obtained by said simulation means and pre-established power consumption data for each logic state, variables in a function description, and said operating frequencies of said mega cells at each input and output terminal, including estimating a current consumed by the mega cells by obtaining logic states for each mega cell, determining an average operation frequency for each logic state, and determining an alternating current component and a direct current component for each logic state to calculate said current consumed by the mega cells; and adding said first and second values of power consumed by said basic and mega cells so as to obtain the power consumption of the integrated circuit.

30. A programmable computer as recited in claim 29, further comprising a read/write unit in which a computer readable media including computer executable code can be input, the computer executable code being downloaded from the computer readable media to the storage media via the read/write unit for execution by the processor.

31. A programmable computer as recited in claim 30, wherein the computer executable code is stored on the computer readable media in compressed format and is decompressed and downloaded to the storage media.

32. A programmable computer as recited in claim 30, wherein the computer readable media comprises at least one of a floppy disk, a CD, DVD and an Internet server.

33. A programmable computer for estimating power consumption of an integrated circuit comprising:

processor;

storage media for storing computer executable code executed by the processor to perform a method for estimating power consumption of an integrated circuit, the method including:

tabulating data of electric power consumed by mega cells of the integrated circuit during operation;

carrying out logic simulations of circuit data for basic cells of the integrated circuit and said mega cells, wherein data from said table is used when simulating logic of said mega cells;

estimating a first value of electric power consumed by said mega cells, including estimating a current consumed by the mega cells by obtaining logic states for each mega cell, determining an average operation frequency for each logic state, and determining an alternating current component and a direct current component for each logic state to calculate said current consumed by the mega cells, said estimate of the first value being based on logic simulation results;

estimating a second value of electric power consumed by said basic cells, including estimating a current consumed by the basic cells, said estimate of the second value being based on logic simulation results and pre-established power consumption data for logic states for each input and output terminal of said basic cells; and adding said first and second values of the power consumed by said mega and basic cells so as to obtain the power consumption of the integrated circuit.

34. A programmable computer as recited in claim 33, further comprising a read/write unit in which a computer readable media including computer executable code can be input, the computer executable code being downloaded from the computer readable media to the storage media via the read/write unit for execution by the processor.

35. A programmable computer as recited in claim 34, wherein the computer executable code is stored on the computer readable media in compressed format and is decompressed and downloaded to the storage media.

36. A programmable computer as recited in claim 34, wherein the computer readable media comprises at least one of a floppy disk, a CD, DVD and an Internet server.

37. A programmed computer which is programmed to perform a method for estimating power consumption of an integrated circuit, the method comprising:

simulating logic of basic and mega cells of the integrated circuit;

estimating a first value of electric power consumed by said mega cells based on said logic simulations and pre-established power consumption data, including estimating a current consumed by the mega cells by obtaining logic states for each mega cell, determining an average operation frequency for each logic state, and determining an alternating current component and a direct current component for each logic state to calculate said current consumed by the mega cells;

estimating a second value of electric power consumed by said basic cells based on said logic simulations and pre-established power consumption data, including estimating a current consumed by the basic cells; and combining said first and second values to obtain the power consumption of the integrated circuit.

38. A programmed computer which is programmed to perform a method for estimating electric power consumed by basic cells and mega cells of an integrated circuit to estimate total power consumed by the integrated circuit, the method comprising:

simulating logic of said basic cells and said mega cells, wherein each function of each mega cell for logic simulation is defined by hardware description language;

estimating a first value of electric power consumed by said basic cells based on logic simulation results from said logic simulations and pre-established power consumption data for each logic state of each input and output terminal of said basic cells, including estimating a current consumed by the basic cells;

estimating a second value of electric power consumed by said mega cells based on logic simulation results from said logic simulations and pre-established power consumption data for said logic states, variables in the function description, and said operating frequencies at each input and output terminal of each mega cell, including estimating a current consumed by the mega cells by obtaining logic states for each mega cell, determining an average operation frequency for each logic state, and determining an alternating current component and a direct current component for each logic state to calculate said current consumed by the mega cells; and adding said first and said second values of the power consumption to determine the total power consumption for the integrated circuit.

39. A programmed computer which is programmed to perform a method for estimating power consumption of an integrated circuit, the method comprising:

compiling a table which tabulates data of electric power consumed by mega cells of the integrated circuit during operation;

simulating logic of said mega cells and basic cells of the integrated circuit, wherein data from said table is used when simulating logic of said mega cells;

estimating a first value of electric power consumed by said mega cells based on results from said logic simulations, including estimating a current consumed by the mega cells by obtaining logic states for each mega cell, determining an average operation frequency for each logic state, and determining an alternating current component and a direct current component for each logic state to calculate said current consumed by the mega cells;

estimating a second value of electric power consumed by said basic cells based on logic simulation results from said simulations and pre-established power consumption data for each logic state at each input and output terminal of said basic cells, including estimating a current consumed by the basic cells; and adding said first and said second values to obtain the power consumption of the integrated circuit.

40. A computer readable medium as recited in claim 1, wherein the alternating current component of said current consumed by the mega cells for each logic state is determined by utilizing a predetermined constant value and the average operation frequency for the logic state.

* * * * *